(12) United States Patent
Raaijmakers

(10) Patent No.: US 7,927,942 B2
(45) Date of Patent: Apr. 19, 2011

(54) SELECTIVE SILICIDE PROCESS

(75) Inventor: Ivo Raaijmakers, Bilthoven (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 12/339,672

(22) Filed: Dec. 19, 2008

(65) Prior Publication Data

US 2010/0155859 A1 Jun. 24, 2010

(51) Int. Cl.
*H01L 21/8238* (2006.01)
(52) U.S. Cl. .. 438/199; 438/682; 438/755; 257/E21.632
(58) Field of Classification Search .................. 438/197, 438/199, 583, 682, 754, 755; 257/E21.632
See application file for complete search history.

(56) References Cited

U.S. PATENT DOCUMENTS

| | | | |
|---|---|---|---|
| 4,058,430 A | 11/1977 | Suntola et al. |
| 4,477,296 A | 10/1984 | Nair |
| 4,521,952 A | 6/1985 | Riseman |
| 4,605,947 A | 8/1986 | Price et al. |
| 4,902,551 A | 2/1990 | Nakaso et al. |
| 4,994,402 A | 2/1991 | Chiu |
| 5,032,233 A | 7/1991 | Yu et al. |
| 5,043,300 A | 8/1991 | Nulman |
| 5,084,406 A | 1/1992 | Rhodes et al. |
| 5,094,977 A | 3/1992 | Yu et al. |
| 5,106,454 A | 4/1992 | Allardyce et al. |
| 5,147,819 A | 9/1992 | Yu et al. |
| 5,187,122 A | 2/1993 | Bonis |
| 5,196,360 A | 3/1993 | Doan et al. |
| 5,231,056 A | 7/1993 | Sandhu |
| 5,236,865 A | 8/1993 | Sandhu et al. |
| 5,278,098 A | 1/1994 | Wei et al. |
| 5,341,016 A | 8/1994 | Prall et al. |
| 5,378,641 A | 1/1995 | Cheffings |
| 5,382,333 A | 1/1995 | Ando et al. |
| 5,389,575 A | 2/1995 | Chin et al. |
| 5,480,814 A | 1/1996 | Wuu et al. |
| 5,508,212 A | 4/1996 | Wang et al. |
| 5,656,519 A | 8/1997 | Mogami |
| 5,656,546 A | 8/1997 | Chen et al. |
| 5,711,811 A | 1/1998 | Suntola et al. |
| 5,731,634 A | 3/1998 | Matsuo et al. |

(Continued)

FOREIGN PATENT DOCUMENTS

DE 41 08 73 3/1925

(Continued)

OTHER PUBLICATIONS

Baglia, J., Associate Editor, "New Designs and Materials Tackle 1 Gb Memory Challenge," *Semiconductor International*, World Wide Web address: semiconductor.net.

(Continued)

*Primary Examiner* — Hoai V Pham
(74) *Attorney, Agent, or Firm* — Knobbe, Martens, Olson & Bear, LLP

(57) ABSTRACT

A method of self-aligned silicidation on structures having high aspect ratios involves depositing a metal oxide film using atomic layer deposition (ALD) and converting the metal oxide film to metal film in order to obtain uniform step coverage. The substrate is then annealed such that the metal in regions directly overlying the patterned and exposed silicon reacts with the silicon to form uniform metal silicide at the desired locations.

31 Claims, 3 Drawing Sheets

U.S. PATENT DOCUMENTS

| | | | |
|---|---|---|---|
| 5,756,394 | A | 5/1998 | Manning |
| 5,856,237 | A | 1/1999 | Ku |
| 5,865,365 | A | 2/1999 | Nishikawa et al. |
| 5,888,903 | A | 3/1999 | O'Brien et al. |
| 5,939,334 | A | 8/1999 | Nguyen et al. |
| 5,945,350 | A | 8/1999 | Violette et al. |
| 6,006,767 | A | 12/1999 | Hecker et al. |
| 6,033,584 | A | 3/2000 | Ngo et al. |
| 6,066,892 | A | 5/2000 | Ding et al. |
| 6,108,937 | A | 8/2000 | Raaijmakers |
| 6,117,761 | A | 9/2000 | Manning |
| 6,124,189 | A | 9/2000 | Watanabe et al. |
| 6,130,123 | A | 10/2000 | Liang et al. |
| 6,136,163 | A | 10/2000 | Cheung et al. |
| 6,143,658 | A | 11/2000 | Donnelly et al. |
| 6,147,405 | A | 11/2000 | Hu |
| 6,183,565 | B1 | 2/2001 | Granneman et al. |
| 6,277,735 | B1 | 8/2001 | Mtsubara |
| 6,372,584 | B1 | 4/2002 | Yu |
| 6,455,935 | B1 | 9/2002 | Hu |
| 6,524,953 | B1 | 2/2003 | Hu |
| 6,743,721 | B2 | 6/2004 | Lur et al. |
| 6,777,331 | B2 | 8/2004 | Nguyen |
| 2002/0013487 | A1 | 1/2002 | Norman et al. |
| 2008/0242059 | A1* | 10/2008 | McSwiney et al. ........... 438/475 |

FOREIGN PATENT DOCUMENTS

| | | |
|---|---|---|
| EP | 0 321 067 | 7/1988 |
| EP | 0 469 456 | 7/1991 |
| EP | 0 469 470 | 5/1992 |
| EP | 0 880 168 | 5/1998 |
| GB | 368850 | 12/1930 |
| GB | 1518243 | 6/1976 |
| GB | 2 340 508 | 2/2000 |
| JP | 60-10673 A | 1/1994 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 01/50502 | 7/2001 |

OTHER PUBLICATIONS

Basceri, C., Ph.D. thesis, "Electrical and Dielectric Properties of (Ba,Sr) TiO$_3$ Thin Film Capacitors for Ultra-High Density Dynamic Random Access Memories," pp. 13-31, Raleigh, N.C. State University (1997).

D., Bursky D "Hit Up IEDM For Gigabit And Denser DRAMs and Merged Logic/Memory," *Electronic Design*, World Wide Web address: planetee.com, (Dec. 1, 1998).

Campbell, S.A. et al., "Titanium dioxide (TiO$_2$)-based gate insulators," *IBM J. Res. Develop.*, vol. 43, No. 3, pp. 383-392 (May 1999).

Fukuzumi, Y. et al., "Liner-Supported Cylinder (LSC) Technology to realize RuiTa$_2$O$_5$/Ru Capacitor for Future DRAMs," *IEEE*, IED 2000, Session 34 (2000).

Hones, P. et al., "MOCVD of ThinRuthenium Oxide Films: Properties and Growth Kinetics," *Chem. Vap. Deposition*, vol. 6, No. 4, pp. 193-198 (2000).

Inoue, N. et al., "Low thermal-budget fabrication of sputtered-PZT capacitor on multilevel interconnects for embedded FeRAM," *IEEE*, IED 2000, Session 34 (2000).

Integrated Circuit Engineering Corporation, Practical Integrated Circuit Fabrication Seminar (1998).

Jeong Soo Byun, Hak Nam Kim et al., "*Formation of a large grain sized TiN layer using TiN$_x$, the epitaxial continuity at the Al/TiN interface . . .* ", J. Appl. Phys. 78(3), Aug. 1, 1995, pp. 1719-1724.

Jeong Soo Byun, Chang Reol Kim et al., "*TiN/TiSi$_2$ Formation Using TiN$_x$ Layer and Its Feasibilities in ULSI*", Jpn. J. Appl. Phys. vol. 35 (1995), pp. 982-986.

Jeong Soo Byun, "*Epitaxial C49-TiSi$_2$ Formation on (100)Si Substrate Using TiN$_x$ and Its Electrical Characteristics as a Shallow Contact Metallization*", J. Electrochem. Soc., vol. 143, No. 6, Jun. 1996, pp. 1984-1991.

Jeong S. Byun, Kwan G. Rha et al., "*Epitaxial TiSi$_2$ Growth on Si(100) From Reactive Sputtered TiN$_x$ and Subsequent Annealing*", Materials Research Soc. Proceedings, vol. 355, Pittsburgh, 1995, pp. 465-470.

Jeong Soo Byun, Jun Ki Kim et al., "*W as a Bit Line Interconnection in Capacitor-Over-Bit-Line (COB) Structured Dynamic Random Access Memory (DRAM) and Feasible Diffusion Barrier Layer*", Jpn. J. Appl. Phys. vol. 35 (1996), pp. 1086-1089.

Jung, D. et al., "A Novel Ir/IrO$_2$/Pt-PZT-Pt/IrO$_2$/Ir Capacitor for A Highly Reliable Mega-Scale FRAM," *IEEE*, IED 2000, Session 34, (2000).

Kawamoto, Y. et al., "The Outlook for Semiconductor Processes and Manufacturing Technologies in the 0.1-μm Age," *Hitachi Review*, vol. 48, No. 6, pp. 334-339 (1999).

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Lou, et al., "*The Process Window of a-Si/Ti Bilayer Metallization for an Oxidation-Resistant and Self-Aligned TiSi2 Process*," IEEE Transactions on Electron Devices, vol. 39, No. 8, Aug. 1992, pp. 1835-1843.

NEC Device Technology International, No. 48, pp. 4-8, (1998).

Onda N. et al., "Hydrogen Plasma Cleaning a Novel Process for IC-Packaging," p. 311, Worldwide Web Address: Semiconductor Fabtech.com.

Pages, et al "The effect of ramp rate—short process time and partial reactions on cobalt and nickel silicide formation," Proceedings 205th ECS Meeting, May 9-13, 2004, San Antonio TX, USA, p. 174-182.

SOI Technology: IBM's Next Advance in Chip Design.

Solanki R. et al., "Atomic Layer Deposition of Copper Seed Layers," *Electrochemical and Solid-State Letters*, vol. 3, No. 10, pp. 479-480 (2000).

Sundani et al., Oral presentation of dual damascene process, slides.

Ueno et al., "Cleaning of CHF3 plasma-etched SiO2/SiN/Cu via structures using a hydrogen plasma, an oxygen plasma, and hexafluoracetylacetone vapors," J.Vac. Sci. Technology B 16(6), pp. 2986-2995 (1998).

Utriainen, M. et al., "Studies of NiO thin film formation by atomic layer epitaxy," *Materials Science & Engineering*, vol. B54, pp. 98-103 (1998).

Utriainen, M. et al., "Studies of metallic thin film growth in an atomic layer epitaxy reactor using M(acac)$_2$ (M=Ni, Cu, Pt) precursors," *Applied Surface Science*, vol. 157, pp. 151-158 (2000).

Van Houtum, H. et al., "*TiSi2 strap formation by Ti-amorphous-Si reaction*," J. Vac. Sci. Technol. B 6(6), Nov./Dec. 1988, pp. 1734-1739.

VVinbond News Release, "Successful Development of Capacitator Technology for Next Generation Memory." World Wide Web address: winbond.com, (Dec. 13, 2000).

Won, Seok-Jun et al., "Conformal CVD-Ruthenium Process for MIM Capacitor in Giga-bit DRAMs," *IEEE*, IED 2000, Session 34 (2000).

Xu, P. et al., "A Breakthrough in Low-k Barrier/Etch Stop Films for Copper Damascene Applications," *Semiconductor Fabtech*, 11th Edition, p. 239 (2000).

Yoon, Dong-Soo et al., "Investigation of RuO$_2$-Incorporated Pt Layer as a Bottom Electrode and Diffusion Barrier for High Epsilon Capacitor Applications," *Electrochemical and Solid-State Letters*, vol. 3, No. 8, pp. 373-376 (2000).

Yoon, Dong-Soo et al., "Tantalum-ruthenium dioxide as a diffusion barrier between Pt bottom electrode and TiSi$_2$ ohmic contact layer for high density capacitors," *Journal of Applied Physics*, vol. 86, No. 5, pp. 2544-2549 (1999).

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, Monday, Wednesday, May 17, 2000, New Applications of RTP, Co-Chairs: A. Fiory and D.-L Kwong, Time 11:10 Abs#550, Title: Development of RTA Process for the Crystallization of a-Si Thin Film—Y.-G. Yoon, T.-K. Kim, K.-B. Kim, J.-Y. Chio, B.-I Lee, and S.-K. Joo (Seoul National Univ.).

\* cited by examiner

SELECTIVE SILICIDE PROCESS

CROSS-REFERENCE TO RELATED APPLICATIONS

This application is related to U.S. Pat. No. 6,482,740, filed May 15, 2001, issued Nov. 19, 2002; U.S. Pat. No. 6,921,712, filed May 15, 2001, issued Jul. 26, 2005; and U.S. Pat. No. 7,153,772, filed Jun. 10, 2004, issued Dec. 26, 2006. The entire contents of all of the above applications are hereby incorporated by reference and should be considered a part of this specification.

BACKGROUND OF THE INVENTION

1. Field of the Invention

The invention relates generally to the field of semiconductor device manufacturing and, more particularly, to silicidation processes.

2. Description of the Related Art

In forming advanced semiconductor devices, part of the silicon that is present in gate, source and drain structures, can be converted into low-resistivity metal silicides. This is done to realize a conductive path with a low bulk resistivity on the one hand, and to ensure a good contact resistance on the other hand. In the past, $TiSi_2$ was used for this process; then later $CoSi_2$ was the silicide of choice for the most advanced devices. As both $TiSi_2$ and $CoSi_2$ consume a relatively large amount of silicon, there has been a switch to using $NiSi_x$ to form these conductive paths. This silicide combines a low bulk resistivity with a relatively low amount of silicon consumption.

A process of forming $NiSi_x$ on a substrate 80 is depicted in FIGS. 1A-1D. First, the basic structure of the transistor is formed, including a gate electrode 10, a gate dielectric 20, a source 30 and a drain 40 (FIG. 1A). On the sides of the polycrystalline silicon (poly-Si) gate, so-called spacers 50 are deposited to insulate the sidewalls of the poly-Si/gate oxide stack from films that are subsequently formed. A nickel film 60 (Ni) is then deposited, usually through a physical vapor deposition (PVD, e.g., sputtering) process (FIG. 1B). The wafer is heated to a temperature at which the Ni reacts with the underlying Si to form nickel silicide ($NiSi_x$) 70. Depending on the anneal temperature, $NiSi_x$ as used herein can represent $Ni_2Si$, NiSi, $NiSi_2$ and/or a mixture thereof. The temperature is typically kept low enough (e.g., <about 600° C.) to avoid formation of $NiSi_2$, which has a relatively high resistivity.

In principle, $NiSi_x$ forms in a self-aligned fashion, i.e., only at locations where Ni and Si are both present. In the illustrated arrangement, such locations have silicon exposed below the metal Ni layer. Thus, ideally, no silicide growth takes place at the position of the spacers 50 (FIG. 1C). FIG. 1C schematically shows that the formation of the silicide film continues until the Ni film has been completely consumed in the regions above exposed silicon. Above the silicon there is no Ni left to react. This process, generally referred to as RTP1 for the first rapid thermal processing step, is generally conducted at temperatures in the range of about 300-400° C.

After this process is finished, the substrate is exposed to a so-called selective metal etch. In this wet etch process, the unreacted Ni is etched while the $NiSi_x$ film remains intact (see FIG. 1D). This results in a low-resistivity silicide on top of the gate, source, drain and any exposed silicon surfaces. By removing the unreacted Ni, these structures are electrically isolated from each other. Usually, a subsequent anneal (RTP2) at, e.g., 450° C. is applied to ensure that the silicide film is made up of NiSi exclusively, for example, $Ni_2Si$ formed during silicidation has completely reacted away. Typically, 100 nm Ni is converted into NiSi with a sheet resistance of ~8 µΩcm.

Thus, in theory, the $NiSi_x$ allows the formation of a conductive path with a low bulk resistivity and a good contact resistance. In practice, however, this process may not be effective in all contexts. For example, for certain semiconductor structures, such as a nonplanar multiple gate transistor, such as FinFETs, it may be desirable to form silicide on vertical walls, in addition to the tops of the gate, source, and drain regions. In other semiconductor devices, it may be beneficial to form silicide in narrow openings or trenches. The result is that the step coverage of the Ni over the three-dimensional structure is poor due, at least in part, to the limitations in the PVD process for depositing the Ni. Variation in thicknesses due to a non-uniform deposition of Ni creates variation in resistivities across the structures on the surface of a substrate. Such variation is undesirable because it can introduce non-uniformities in the electrical performance of electrical devices formed using the $NiSi_x$ films.

Depositing Ni by more conformal processes like atomic layer deposition (ALD) has not been straightforward. Accordingly, there is a need for methods of forming conformal $NiSi_x$ films having more uniform resistivities on complex structures.

SUMMARY OF THE INVENTION

In one aspect, methods for selective silicidation are provided. In some embodiments, methods comprise providing a substrate comprising a three-dimensional structure, where the structure has one or more exposed silicon regions. The substrate is alternately and sequentially contacted with a metal source precursor and an oxygen source precursor to form a metal oxide film directly over the exposed silicon regions. The metal oxide film is then reduced to a metal film. Subsequently, the metal film is annealed to form a metal silicide film over the exposed silicon regions. Etching can be used to remove any unreacted metal film.

In other embodiments, methods for semiconductor fabrication are provided. The methods generally comprise depositing a metal oxide film on a substrate comprising exposed silicon by atomic layer deposition (ALD), reducing the metal oxide film to a metal film, and annealing the metal film to form a metal silicide film in at least one region where the metal film contacts the silicon.

In yet other embodiments, methods for selective silicidation are provided. The methods comprise forming a nickel oxide thin film on a substrate having at least one exposed silicon region by at least one cycle of an atomic layer deposition (ALD) process. One cycle comprises contacting a substrate with a nickel source precursor and an oxygen source precursor. The methods further comprise reducing the nickel oxide film to a nickel film, and annealing the nickel film to form a nickel silicide film over the exposed silicon region. Etching can be used to remove unreacted nickel film.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1A:
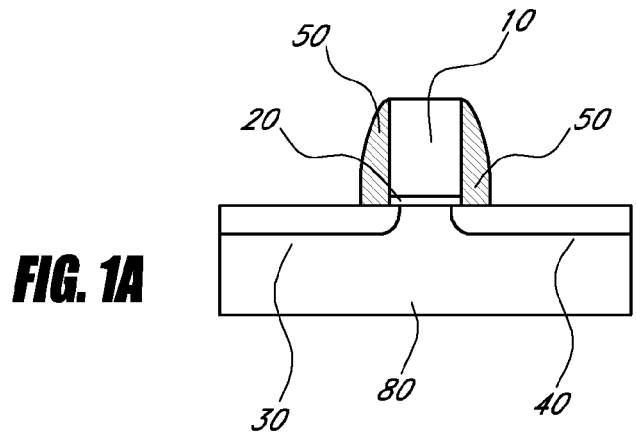
FIGS. 1A-1D are schematic cross-sections of a partially fabricated integrated circuit, illustrating the formation of $NiSi_x$ films on the top of gate, source and drain regions of a transistor.
Figure 1B:
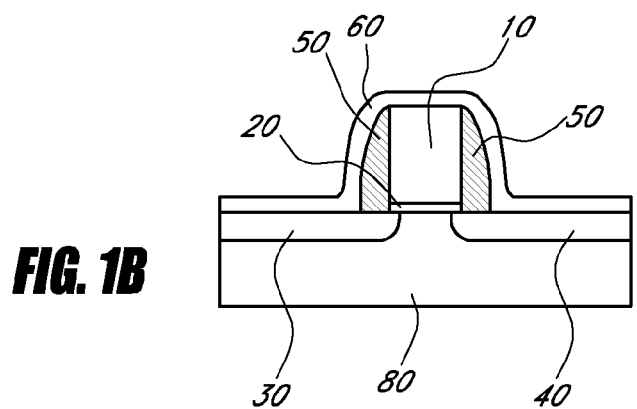
Figure 1C:
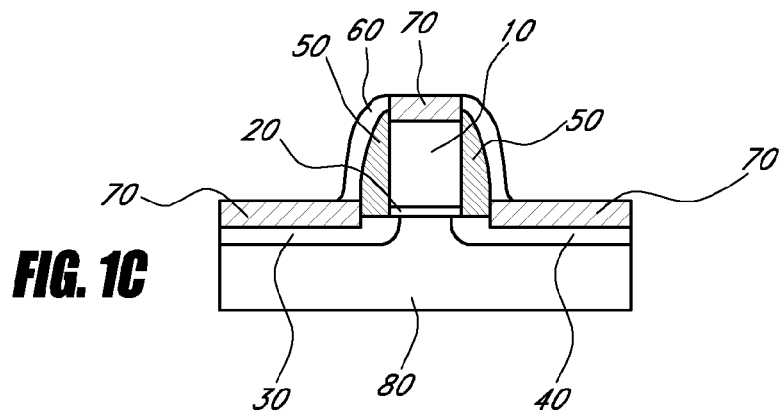
Figure 1D:
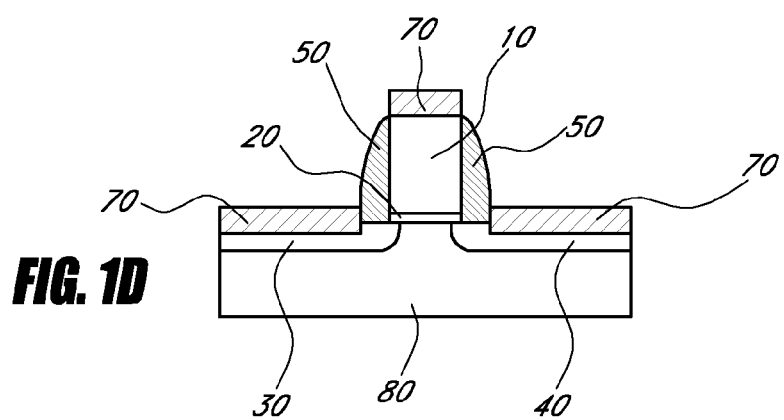

As semiconductor structures evolve due to advances in technology, new techniques in silicidation are needed in order to deposit uniform self-aligned silicide layers on three-dimensional structures. Traditional methods of silicidation are most effective when the desired regions of silicide deposition are mainly horizontal surfaces, such as source and drain regions. In situations in which the desired regions of silicide formation include vertical regions, such as the walls of three dimensional transistors, the traditional methods utilizing physical vapor deposition (PVD) can ruin the three dimensional transistor's performance by consuming from about 60% to about 100% of the silicon to form silicide. This is because traditional methods of PVD silicidation require relatively thick films to be deposited due to poor step coverage and uniformity across the three dimensional structures and non-uniform resistivities.

One possible solution to the problem of poor step coverage in the silicidation of three dimensional structures would be to employ a known conformal deposition process, such as atomic layer deposition (ALD). ALD of Ni, however, has not been shown to provide good step coverage. Therefore, one cannot simply replace the PVD step in a silicidation process flow with an ALD step in order to achieve good step coverage.

The present inventors have found that this problem can be overcome for Ni and other metals by depositing a metal oxide by ALD and then converting the metal oxide to a metal. The metal can then be converted to a silicide in a self-aligned silicidation process.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. Here, the temperature is preferably at or below about 400° C., more preferably at or below about 300° C.

A first reactant is conducted into the chamber in the form of vapor phase pulse and contacted with the surface of a substrate comprising a three dimensional structure. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing metal oxides in situations where highly conformal step coverage over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin metal oxide film of the desired thickness has been formed on the substrate, with each cycle leaving no more than a molecular monolayer.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage.

According to a preferred embodiment, a metal oxide thin film is formed on a substrate by an ALD type process comprising multiple pulsing cycles, each cycle comprising:
 pulsing a vaporized metal precursor into the reaction chamber to form at most a molecular monolayer of the metal precursor on the substrate,
 purging the reaction chamber to remove excess metal precursor and reaction by products, if any,
 providing a pulse of a second reactant comprising an oxygen source onto the substrate,
 purging the reaction chamber to remove excess second reactant and any gaseous by-products formed in the reaction between the metal precursor layer on the first surface of the substrate and the second reactant, and
 repeating the pulsing and purging steps until a metal oxide thin film of the desired thickness has been formed.

The thin metal oxide film typically comprises multiple monolayers of a single metal oxide. However, in other embodiments, the final metal structure may comprise two or more different metal oxides. For example, the growth can be started with the deposition of a first metal oxide and ended with the deposition of a second metal oxide. In other embodiments, alternating layers of metal oxides can be deposited.

The substrate can comprise various types of materials. When manufacturing integrated circuits, the substrate typically comprises a number of thin films with varying chemical and physical properties. For example and without limitation, the substrate may comprise a dielectric layer, such as aluminum oxide, hafnium oxide, hafnium silicate, tantalum oxide, zirconium oxide, a metal, such as Ta, Ti, or W, a metal nitride, such as TaN, TiN, NbN, MoN or WN, silicon, silicon germanium, germanium or polysilicon. Further, the substrate surface may have been patterned and may comprise structures such as nodes, vias, trenches, transistors, FinFETs, or microelectromechanical systems (MEMS).

The metal oxide is preferably selected from the group consisting of Ni, Ti, Zr, Hf, V, Nb, Ta, Cr, Mo, W, Co, Cu, Fe, Ru, Ir, Rh, Pd and Pt oxides and may be in some cases electrically conductive, such as in a case of $IrO_2$ or $RuO_2$.

Suitable metal precursors may be selected by the skilled artisan. In general, metal compounds where the metal is bound or coordinated to oxygen, nitrogen, carbon or a combination thereof are preferred. In some embodiments the metal precursors are organic compounds. More preferably betadiketonate or cyclopentadienyl compounds or derivatives thereof are used. In some embodiments, $X(acac)_y$ or $X(thd)_y$ compounds are used, where X is a metal, y is generally, but not necessarily between 2 and 3 and thd is 2,2,6,6-tetramethyl-3,5-heptanedionato.

When depositing nickel oxide thin films, preferred metal precursors can be selected from the group consisting of nickel betadiketonate compounds, nickel cyclopentadienyl compounds, nickel carbonyl compounds and combinations thereof. The nickel precursor may also comprise one or more halide ligands. In preferred embodiments, the precursor is $Ni(acac)_2$, $Ni(thd)_2$ or $Ni(cp)_2$ or derivatices thereof.

In some embodiments electrically conductive nickel oxide, preferably NiO, is deposited from alternating and sequential pulses of a Ni precursor and an oxygen source, like water, ozone, oxygen plasma, oxygen radicals or oxygen atoms. The Ni precursor preferably comprises a betadiketonate and more preferably is $Ni(acac)_3$. The reaction temperature is preferably less than about 300° C., more preferably less than about 200° C. In some embodiments, the reaction temperature can be in the range of about 60 to about 150° C. for example, in the case of $Ni(cp)_2$.

The metal precursor employed in the ALD type processes may be solid, liquid or gaseous material under standard conditions (room temperature and atmospheric pressure), provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds.

Preferably, for a 300 mm wafer in a single wafer ALD reactor, the metal precursor is pulsed for from about 0.05 to 10 seconds, more preferably for from about 0.1 to 5 seconds and most preferably for from about 0.3 to 3.0 seconds. The oxygen-containing precursor is preferably pulsed for from about 0.05 to 10 seconds, more preferably for from about 0.1 to 5 seconds, most preferably for from about 0.2 to 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In one embodiment, for deposition on 300 mm wafers the flow rate of the metal precursor is preferably between about 1 and 1000 sccm without limitation. The mass flow rate of the metal precursor is usually lower than the mass flow rate of the oxygen source, which is usually between about 10 and 10000 sccm without limitation, more preferably between about 100-2000 sccm and most preferably between about 100-1000 sccm.

The pressure in the reaction chamber is typically from about 0.01 to 20 mbar, more preferably from about 1 to about 10 mbar. However, in some cases the pressure will be higher or lower than this range, as can be readily determined by the skilled artisan.

The oxygen source may be an oxygen-containing gas pulse and can be a mixture of oxygen and inactive gas, such as nitrogen or argon. In some embodiments the oxygen source may be a molecular oxygen-containing gas pulse. The preferred oxygen content of the oxygen-source gas is from about 10 to 25%. Thus, one source of oxygen may be air. In some embodiments, the oxygen source is molecular oxygen. In preferred embodiments, the oxygen source comprises an activated or excited oxygen species. In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen source is oxygen plasma.

As mentioned above, the metal oxide ALD process typically comprises alternating pulses of metal precursor and a reactant comprising an oxygen source. The oxygen source pulse may be provided, for example, by pulsing ozone or a mixture of ozone and another gas into the reaction chamber. In other embodiments, ozone is formed inside the reactor, for example by conducting oxygen containing gas through an arc. In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma the pathway to the substrate can be optimized to maximize electrically neutral species and minimize ion survival before reaching the substrate.

Before starting the deposition of the film, the substrate is typically heated to a suitable growth temperature. Preferably, the growth temperature of the metal thin film is less than about 400° C., more preferably less than about 350° C. and even more preferably less than about 200° C. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan using routine experimentation.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases, for example, where large surface areas and volumes are present.

Examples of suitable reactors that may be used for the deposition of thin films according to the processes of the present invention include commercially available ALD equipment such as the F-120 reactor, Pulsar® reactor and EmerALD® reactor, available from ASM America, Inc of Phoenix, Ariz. and Advance® 400 Series reactors available from ASM Europe B.V., Almere, Netherlands. In addition to these ALD reactors, many other kinds of reactors capable of ALD growth of thin films, including CVD reactors equipped with appropriate equipment and means for pulsing the precursors, can be employed. Preferably, reactants are kept separate until reaching the reaction chamber, such that shared lines for the precursors are minimized. However, other arrangements are possible, such as the use of a pre-reaction chamber as described in U.S. application Ser. No. 10/929, 348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Figure 2:
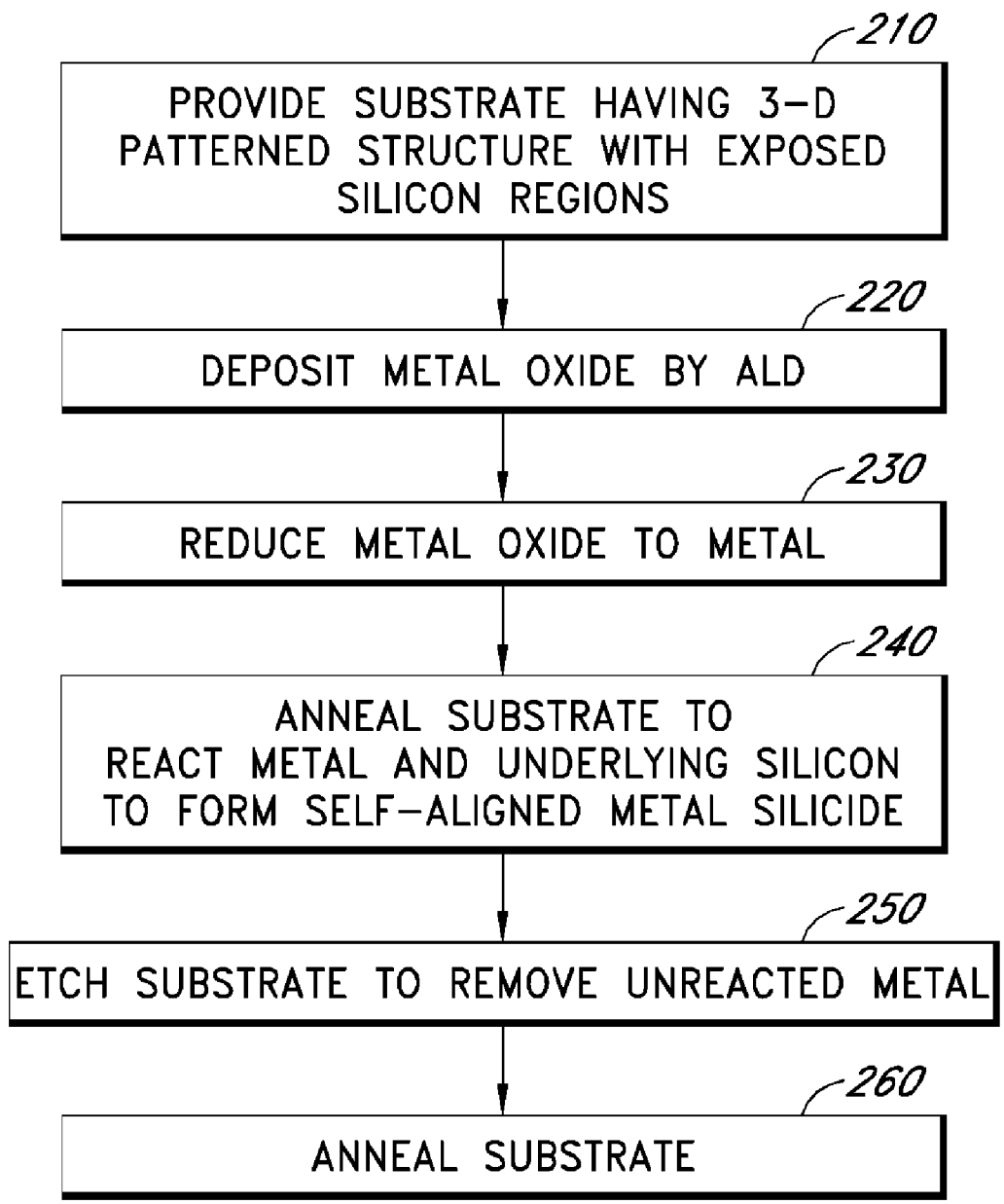
FIG. 2 is a flow chart illustrating a process flow, in accordance with certain embodiments of the present invention.

A general process flow is illustrated in FIG. 2. First, a substrate is provided in a reaction space, which in certain embodiments is a volume in a reactor in which conditions can be adjusted to effect film growth by ALD processes 210. In certain embodiments, the substrate has one or more three-dimensional patterned structures with one or more exposed silicon regions amid insulating regions on one or more vertical surfaces. In certain embodiments, the exposed silicon regions may include silicon forming a gate electrode, or source and drain regions.

A metal oxide, such as nickel oxide, is then deposited by ALD to form a conformal thin film of between about 1 nm and about 200 nm, preferably between about 3 nm and about 100 nm in thickness 220. In some embodiments, the metal oxide is deposited on at least one vertical surface. Although described in terms of NiO deposition, the method may be readily adjusted to deposit other metal oxides. As discussed previously, deposition of metal oxide takes place in a reaction space maintained at less than about 300° C., more preferably less than about 250° C. and even more preferably less than about 200° C. and between about 0.01 and about 20 mbar, more preferably between about 1 and about 10 mbar. In certain embodiments, deposition by ALD comprises contacting the substrate with a vapor phase metal source chemical and a vapor phase oxygen source chemical. This may be done sequentially with either the metal source chemical or the oxygen source chemical being pulsed into the reaction space before the other. In certain embodiments, a purge gas may be introduced into the reaction space between sequential pulses of the metal and oxygen source chemicals to aid in removing excess reactant and reaction byproducts, if any, from the reaction space. In certain embodiments, purging may take place with the aid of a vacuum pump. In other embodiments, if an inert carrier gas is used to help flow in the metal or oxygen source chemicals, the inert gas may also function as the purge gas.

The metal source chemical may comprise Ni, Ti, Zr, Hf, V, Nb, Ta, Cr, Mo, W, Co, Cu, Fe, Ru, Ir, Rh, Pd and Pt. The oxygen source chemical may be chosen from $O_2$, $H_2O$, $O_3$, oxygen plasma, oxygen radicals or oxygen atoms or a reactive oxygen gas. By depositing metal oxide by ALD, the metal oxide is placed in direct contact with the silicon sublayer in at least one location, but preferably a plurality of regions.

The metal oxide layer, such as nickel oxide, is then reduced to metal 230. In certain embodiments, as discussed in U.S. Pat. No. 6,921,712, which is incorporated by reference, the metal oxide layer is contacted with vapor phase reducing agents, which may include $H_2$, $NH_3$, hydrogen containing plasma, hydrogen radicals or hydrogen atoms and reactive organic compounds, which contain at least one functional group selected from the group of alcohol (—OH), aldehyde (—CHO), and carboxylic acid (—COOH). The vapor phase reducing agents form stronger bonds with the oxygen in the metal oxide layer than the metal to the oxygen. Thus, the gaseous reducing agent is capable of taking away the oxygen that was bound to the metal oxide and thus leaving an elemental metal layer on the substrate surface. This reduction step can be performed at temperatures between about 25° C. and about 400° C. and has the benefit of a high rate of reduction, an operation time of between about 1 s and about 1000 s, and low levels of carbon or hydrogen impurities. A skilled artisan will recognize that the metal oxide layer may be reduced to metal by other methods known in the art, such as for example by $H_2$ plasma, formic acid or ethanol.

In one embodiment, the NiO layer is reduced by exposure to an organic reducing agent that is capable of removing oxygen from the metal oxide, leaving elemental nickel on the substrate. Preferably the NiO layer is reduced by exposure to an organic reducing agent in vapor form.

The substrate containing the nickel oxide layer to be reduced is placed in a reaction space, such as an ALD reaction chamber, and the reaction space is evacuated to vacuum. The organic reducing agent is preferably vaporized and fed to the reaction space, optionally with the aid of an inert carrier gas, such as nitrogen. In one embodiment a vapor mixture is used, comprising two or more reducing agents.

The reducing agent vapor is contacted with the substrate, preferably at low pressure, whereby the nickel oxide layer is reduced at least partly to nickel metal and the reducing agent is oxidized. Typically the reaction space is then purged with an inert carrier gas to remove the unreacted organic reducing agent and the reaction products and/or by-products.

The reactions between nickel oxide and the organic reducing agent may be carried out in a wide temperature range, even as low as room temperature. Preferably, reduction with an organic reducing agent is carried out at low temperatures. Kinetic factors and the diffusion rate of oxygen from nickel oxide to the nickel surface set a lower limit to the actual process temperatures that can be applied successfully. The temperature in the reaction space is preferably in the range of 200 to 450° C., more preferably 300 to 430° C. and even more preferably 310 to 400° C. In some cases, such as the case of very thin metal oxide films, the reduction temperature can be even lower than 200° C. For example, in case of hydrogen containing plasma, hydrogen radical or hydrogen atom reduction can be performed from about 20° C. to about 450° C. If the reduction and subsequent process steps are carried out in situ, reduction is preferably carried out at the same temperature as subsequent process steps, preferably 400° C. If reduction and subsequent process steps are not carried out in situ, the reduction temperature may be less than 400° C. Reduction and subsequent silicidation step may also happen simultaneously.

The pressure in the reaction space is preferably from 0.01 to 20 mbar, more preferably from 1 to 10 mbar.

The processing time will vary according to the thickness of the layer to be reduced. A layer of nickel oxide having a thickness of up to 300 to 400 nm can be reduced in approximately 3 to 5 minutes. For layers having a thickness of approximately 0.1 to 10 nm, the processing time is in the order of seconds. Reduction step may be somewhat faster in case of plasma reduction.

According to preferred embodiments of the present invention, NiO is reduced to nickel with one or more organic reducing agents. The organic reducing agents preferably have at least one functional group selected from the group consisting of alcohol (—OH), aldehyde (—CHO), and carboxylic acid (—COOH).

The need for sufficient vapor pressure, sufficient thermal stability at the process temperature and the need for sufficient reactivity are preferably considered in selecting the reducing agent(s) to be used. Sufficient vapor pressure means that there should be enough chemical molecules in the gas phase near the substrate to enable reduction reactions. Sufficient thermal stability means, in practice, that the reducing agent itself should not form growth-disturbing condensable phases on the substrate or leave harmful levels of impurities on the substrate through thermal decomposition. Further selection criteria include the availability of the chemical at high purity and the ease of handling.

The reducing agents are also preferably selected such that the reaction by-products are volatile and can be easily removed from the reaction space. In the reduction of nickel oxide, the reducing agent is oxidized. Thus, alcohols are oxidized into aldehydes and ketones, aldehydes are oxidized into carboxylic acids and carboxylic acids are oxidized into carbon dioxide. Depending on the specific reactants, water may be formed as a gaseous by-product.

In one embodiment, reducing agents that comprise relatively bulky molecules are used, such as alcohols, aldehydes and carboxylic acids. Bulky source chemical molecules do not easily diffuse inside the metal oxide film. Thus, the reduction reaction takes place only at the surface of the metal oxide layer. Without wishing to be held to a particular theory, it is believed that during the reduction process, oxygen ions diffuse toward the surface where oxygen is depleted by the reducing chemicals. Gaseous by-products are not formed inside the film, but only at the surface. The structural integrity of the metal film is thereby preserved and the formation of pinholes in the film is avoided.

Reducing agents containing at least one alcohol group are preferably selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an -OH group attached to a carbon atom which is bonded to another carbon atom, in particular primary alcohols according to the general formula (I):

$$R^1\text{—OH} \tag{I}$$

wherein $R^1$ is a linear or branched $C_1$-$C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

(II)

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

(III)

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}\text{—}R^2\text{—OH} \tag{IV}$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other preferred derivatives of alcohols include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in one embodiment preferred reducing agents are aldehydes having the general formula (V):

$$R^3\text{—CHO} \tag{V}$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In another embodiment preferred reducing agents are aldehydes having the general formula (VI):

$$OHC\text{—}R^4\text{—CHO} \tag{VI}$$

wherein $R^4$ is a linear or branched $C_1$-$C_{20}$ saturated or unsaturated hydrocarbon. Alternatively, the aldehyde groups may be directly bonded to each other ($R^4$ is null).

Preferred reducing agents containing at least one —COOH group are preferably selected from the group consisting of compounds of the general formula (VII), polycarboxylic acids, halogenated carboxylic acids and other derivatives of carboxylic acids.

Thus, in one embodiment preferred reducing agents are carboxylic acids having the general formula (VII):

$$R^5\text{—COOH} \tag{VII}$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

While nickel oxide reduction is preferably achieved by contacting the substrate with organic reducing agents, other methods of reduction are contemplated. In one embodiment, nickel oxide is reduced by treatment with $H_2$ plasma. Briefly, the substrate comprising the nickel oxide is placed in a reaction chamber, such as an ALD reaction chamber. A gas mixture comprising $H_2$ is allowed to flow into the chamber and Radio Frequency (RF) power is applied to create a plasma discharge in the $H_2$ gas. The plasma discharge reduces the nickel oxide, leaving elemental nickel. Care must be taken not to damage the nickel surface or other exposed substrate surfaces.

In a further embodiment, nickel oxide is reduced by exposure to $H_2$ gas at elevated temperature. Briefly, the substrate comprising the nickel oxide is placed in a reaction chamber. $H_2$ gas is allowed to flow into the reaction chamber. The temperature of the reaction chamber is set to between about 200° C. and 600° C., more preferably to about 500° C.

Following reduction of the metal oxide to metal, the substrate is then annealed 240 at a silicidation temperature, i.e., the temperature at which conversion of the metal layer to a silicide occurs. For example, the silicidation temperature is the temperature at which conversion of the Ni layer into $NiSi_x$ takes place. In some embodiments, the temperature of conversion is between about 250° C. and about 350° C. Preferably, the anneal is a rapid thermal anneal, in which heating is conducted for less than about 2 minutes, more preferably less than about 1 minute. The silicide film formed by annealing advantageously has better adhesion to the underlying silicon substrate and has a more diffuse boundary than a similar film formed by, e.g., deposition processes. It will be appreciated that in certain embodiments, the silicide films preferably contact underlying source and drains regions.

It will also be appreciated that the annealing step can be performed in the same reaction space as the previous metal oxide layer deposition and/or reduction. The annealing step may also be performed in an anneal station different from the reaction space for the deposition and/or reduction. Such an anneal station can be, e.g., the reactor of a Levitor® system, commercially available from ASM International, N.V. of Bilthoven, The Netherlands. A reactor according to the Levitor® design is described in U.S. Pat. No. 6,183,565, the entire disclosure of which is incorporated herein by reference.

In certain embodiments, the silicidation temperature is close to or the same as the reduction temperature. It is therefore possible to reduce the metal oxide layer to metal and almost simultaneously react the metal with the underlying silicon to form metal silicide. Thus, in some embodiments reduction and silicidation are carried out in situ at the same temperature. In fact, in some embodiments there is not a separate anneal step.

The unreacted metal, e.g. Ni, can then be selectively etched from the substrate 250. The removal of unreacted metal can be used to electrically isolate regions containing the metal silicide films from each other. Thus, a low-resistivity silicide can be formed on exposed horizontal and vertical silicon surfaces.

In certain embodiments, an additional conversion step may be performed to convert metal silicide from one phase to the desired phase. For example, a person of skill in the art would understand that $NiSi_x$ can refer to $Ni_2Si$, $NiSi$, $NiSi_2$, or a combination of the three. As NiSi has a relatively lower resistivity, the skilled artisan may choose to convert any remaining $NiSi_x$ to NiSi. In some embodiments, the conversion step may be carried out in the same reaction space as the metal oxide deposition step and/or the annealing step. In other embodiments, the conversion step may be performed in a separate reaction space. The conversion step may preferably be carried out at a temperature between about 200° C. and about 500° C., a pressure between about 0.01 mbar and about 10 mbar, and from about 5 s to about 1000 s.

In some embodiments, silicidation is carried out on one or more vertical surfaces, which may be part of a trench or a three-dimensional structure protruding upward from the surface of the substrate. In other embodiments, silicidation may be carried out on a planar surface or a non-planar surface. Silicidation may be carried out on a three-dimensional surface or on a surface perpendicular to the substrate surface. Silicidation may also be carried out on a non-uniform surface. A person skilled in the art would understand that the disclosed silicidation process may be carried out on various surfaces and structures within the scope of the present invention.

Figure 3:
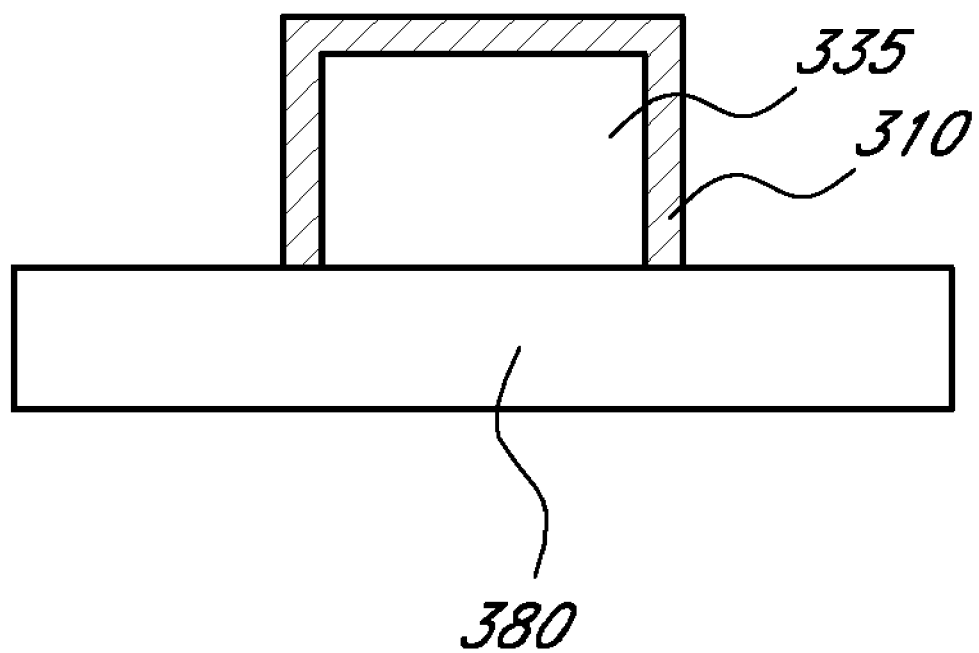
FIG. 3 is a schematic cross-section of a source (or drain) area of a three-dimensional transistor after $NiSi_x$ is formed in accordance with certain embodiments of the present invention.

FIG. 3 illustrates a schematic cross-section of a source (or drain) area of a three-dimensional transistor after an ALD silicidation process, according to certain embodiments of the present invention. As illustrated, the transistor has a source (or drain) 335 connecting a channel (not shown) and drain (or source) (not shown) on a substrate 380. A uniform layer of $NiSi_x$ 310 is formed over the source (or drain) 335, which provides the benefit of a more uniform resistivity. In certain embodiments, the three-dimensional transistor may include double-gate field effect transistors (DG FET), and other types of multiple gate FETs, including FinFETs for example as found in IBM J. Res. & Dev. Vol. 46 No. 2/3 (2002) by H.-S. P. Wong and Tri-gate FET's for example as found in VLSI Technology Digest of Technical Papers, June 2006, pp. 62-63 by J. Kavalieros and which are each incorporated herein by reference.

Although in the present disclosure reference is made to nickel oxide, nickel, and nickel silicide, it will be apparent to the skilled artisan that the present invention is applicable to silicidation processes for any metal that is able to react with silicon to form a silicide. Examples of such metals include Ti, Zr, Hf, V, Nb, Ta, Cr, Mo, W, Co, Cu, Fe, Ru, Ir, Rh, Pd and Pt.

In addition, while particularly useful in transistors below technology nodes 65 nm, and preferably for the technology nodes below 45 nm, and more preferably for the technology nodes from 32 nm to 22 nm or smaller nodes, it will be appreciated that the teachings herein have applicability to forming devices of any dimension.

Furthermore, though described in the context of silicidation over patterned transistors, it will be apparent to the skilled artisan that the above described process will be beneficial for self-aligned silicidation at any of a number of integrated circuit fabrication steps and in other contexts.

Similarly, various other modifications, omissions and additions may be made to the methods and structures described above without departing from the scope of the invention. All such modifications and changes are intended to fall within the scope of the invention, as defined by the appended claims.

What is claimed is:
1. A method for selective silicidation, comprising:
   providing a substrate comprising a three-dimensional transistor structure, wherein the structure has one or more exposed vertical silicon regions;
   alternately and sequentially contacting the substrate with a metal source precursor and an oxygen source precursor to form a metal oxide film about 1 to 200 nm thick directly over the exposed vertical silicon regions;
   reducing the metal oxide film to a metal film; and
   annealing the metal film to form a metal silicide film over the exposed vertical silicon regions.

2. The method of claim 1, further comprising a conversion step to convert the metal silicide film to a phase of lower resistivity after annealing.

3. The method of claim 1, wherein the transistor comprises a FinFET.

4. The method of claim 1, wherein the metal source precursor comprises at least one of Ni, Co, Cu, Fe, Ru, Rh, Pt and Pd.

5. The method of claim 4, wherein the metal source precursor comprises nickel.

6. The method of claim 5, wherein the metal source precursor is $Ni(cp)_2$.

7. The method of claim 1, wherein the oxygen source precursor is chosen from a group consisting of $O_2$, $H_2O$, $O_3$, oxygen plasma, oxygen radicals or oxygen atoms or a reactive oxygen gas.

8. The method of claim 1, wherein the reducing step comprises contacting the substrate with a vapor phase reducing agent.

9. The method of claim 8, wherein the vapor phase reducing agent is chosen from a group consisting of $H_2$, $NH_3$, hydrogen containing plasma, hydrogen radicals, hydrogen atoms, an alcohol, an aldehyde, and a carboxylic acid.

10. The method of claim 8, wherein the reducing step occurs at a temperature less than about 400° C.

11. The method of claim 1, wherein the reducing step and the annealing step are conducted simultaneously.

12. The method of claim 1, wherein the annealing step is conducted at a temperature from about 200° C. to about 500° C.

13. The method of claim 1, wherein the annealing step has a duration sufficient for portions of the metal film overlying the exposed silicon regions of the three-dimensional structure to react to form metal silicide, wherein the duration is less than about 2 minutes.

14. The method of claim 1, wherein the thickness of the metal silicide film is between about 3 nm and about 200 nm.

15. A method for semiconductor fabrication, comprising:
depositing a metal oxide film about 1 to about 200 nm thick on a substrate comprising one or more exposed vertical silicon surfaces by atomic layer deposition (ALD);
reducing the metal oxide film to a metal film; and
annealing the metal film to form a metal silicide film in at least one region wherein the metal film contacts the vertical silicon surfaces.

16. The method of claim 15, further comprising converting the metal silicide film to a phase of lower resistivity.

17. The method of claim 16, wherein the metal silicide film is chosen from a group consisting of $Ni_2Si$, $NiSi$, $NiSi_2$.

18. The method of claim 17, wherein the phase of lower resistivity comprises NiSi.

19. The method of claim 15, wherein the substrate comprises a three-dimensional structure.

20. The method of claim 15, wherein the ALD process comprises:
contacting the substrate with a metal precursor;
removing any unreacted metal precursor and reaction by-products;
contacting the substrate with an oxygen precursor; and
removing any unreacted oxygen precursor and reaction by-products.

21. The method of claim 15, wherein reducing the metal oxide film to a metal film comprises contacting the metal oxide film with a vapor phase reducing agent, wherein the vapor phase reducing agent is chosen from the group consisting of $H_2$, $NH_3$, plasma, and reactive organic compounds.

22. The method of claim 21, wherein reducing the metal oxide film to a metal film is conducted at a temperature from about 250° C. to about 350° C.

23. The method of claim 15, wherein reducing the metal oxide film to a metal film and annealing the metal film to form a metal silicide film are conducted in a shared reaction space.

24. The method of claim 23, wherein reducing the metal oxide film to a metal film and annealing the metal film to form a metal silicide film are conducted simultaneously.

25. A method for selective silicidation, comprising:
forming a nickel oxide thin film about 1 to 200 nm thick by at least one cycle of an atomic layer deposition (ALD) process, wherein one cycle comprises:
contacting a substrate with a nickel source precursor;
contacting the substrate with an oxygen source precursor, wherein the substrate has at least one exposed vertical silicon region;
reducing the nickel oxide film to a nickel film; and
annealing the nickel film to form a nickel silicide film over the exposed vertical silicon region.

26. The method of claim 25, wherein the nickel source precursor is chosen from a group consisting of nickel betadiketonate compounds, nickel cyclopentadienyl compounds, and nickel carbonyl compounds.

27. The method of claim 26, wherein the nickel source precursor may comprise $Ni(acac)_3$, $Ni(cp)_2$ or $Ni(thd)_3$.

28. The method of claim 25, wherein the oxygen source precursor is chosen from a group consisting of $O_2$, $H_2O$, $O_3$, oxygen plasma, oxygen radicals or oxygen atoms or a reactive oxygen gas.

29. The method of claim 25, wherein reducing the nickel oxide film to a nickel film comprises contacting the nickel oxide film with a vapor phase reducing agent, wherein the vapor phase reducing agent is chosen from the group consisting of $H_2$, $NH_3$, hydrogen containing plasma, hydrogen radicals, hydrogen atoms, an alcohol, an aldehyde, and a carboxylic acid, and reactive organic compounds.

30. The method of claim 29, wherein the vapor phase reducing agent is an $H_2$ plasma.

31. The method of claim 25, wherein reducing the nickel oxide film to a nickel film and annealing the nickel film to form a nickel silicide film are carried out in situ.

* * * * *